United States Patent
Britt et al.

(10) Patent No.: US 7,393,790 B2
(45) Date of Patent: Jul. 1, 2008

(54) METHOD OF MANUFACTURING CARRIER WAFER AND RESULTING CARRIER WAFER STRUCTURES

(75) Inventors: Jeffrey Carl Britt, Cary, NC (US); Michael Paul Laughner, Clayton, NC (US); Craig William Hardin, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/223,298

(22) Filed: Sep. 9, 2005

(65) Prior Publication Data
US 2006/0057850 A1 Mar. 16, 2006

Related U.S. Application Data

(60) Provisional application No. 60/609,039, filed on Sep. 10, 2004.

(51) Int. Cl.
*H01L 21/302* (2006.01)
*B44C 1/22* (2006.01)

(52) U.S. Cl. ............ 438/692; 438/693; 438/745; 216/84; 216/88; 216/89

(58) Field of Classification Search ........ 438/692, 438/693, 745; 216/84, 88, 89
See application file for complete search history.

(56) References Cited

U.S. PATENT DOCUMENTS

| | | | |
|---|---|---|---|
| 4,946,547 A | 8/1990 | Palmour et al. | |
| 5,557,146 A | 9/1996 | Britt et al. | |
| 5,659,192 A | * 8/1997 | Sarma et al. | 257/347 |
| 6,281,032 B1 | 8/2001 | Matsuda et al. | |
| 6,286,685 B1 | * 9/2001 | Kononchuk et al. | 209/2 |
| 2001/0035580 A1 | 11/2001 | Kawai | |
| 2004/0043616 A1 | * 3/2004 | Harrison et al. | 438/690 |
| 2004/0209402 A1 | * 10/2004 | Chai et al. | 438/122 |
| 2005/0104072 A1 | 5/2005 | Slater et al. | |
| 2005/0151138 A1 | 7/2005 | Slater et al. | |

FOREIGN PATENT DOCUMENTS

WO WO 9809804 3/1998

OTHER PUBLICATIONS

Search Report for ROC (Taiwan) Patent Application No. 094131347; Search Completion Date: Apr. 26, 2007; 1 page.

* cited by examiner

*Primary Examiner*—Binh X Tran
(74) *Attorney, Agent, or Firm*—Summa, Allan & Additon, P.A.

(57) ABSTRACT

A method is disclosed for preparing carrier wafers for semiconductor device manufacture. The method includes the steps of sorting a plurality of standard carrier wafer blanks into batches by thickness to define a batch of starting carrier wafers that are within a predetermined tolerance of one another, reducing the thickness of the sorted carrier wafers to within 10 microns of a final target thickness, and polishing the sorted carrier wafers to the final target thickness. The polished carrier wafers are mounted to device precursor wafers having at least one semiconductor epitaxial layer on a substrate by joining one surface of a carrier wafer to the epitaxial layer on a substrate. The thickness of the device precursor wafer is then reduced by removing material from the device precursor substrate opposite the joined epitaxial layer.

27 Claims, 2 Drawing Sheets

METHOD OF MANUFACTURING CARRIER WAFER AND RESULTING CARRIER WAFER STRUCTURES

BACKGROUND

This application claims priority from Ser. No. 60/60/609,039 filed Sep. 10, 2004. The present invention relates to the manufacture of carrier wafers for use in processing semiconductor wafers. In particular, the invention relates to the manufacture of carrier wafers with properties that enhance the controlled thinning of semiconductor wafers mounted on the carrier wafers.

Silicon carbide (SiC) has emerged over the last two decades as a candidate semiconductor material that offers a number of advantages over other more conventional semiconductor materials such as silicon and gallium arsenide. In particular, silicon carbide has a wide bandgap, a high breakdown electric field, a high thermal conductivity, and a high saturated electron drift velocity, and is physically extremely robust. In particular, silicon carbide has an extremely high melting point and is one of the hardest known materials in the world.

Because of its physical properties, however, silicon carbide is also relatively difficult to produce. Because silicon carbide can grow in many polytypes, it is difficult to grow into large single crystals. The high temperatures required to grow silicon carbide also make control of impurity levels (including doping) relatively difficult, and likewise raise difficulties in the production of thin films (e.g. epitaxial layers) on the material. Because of its hardness, the traditional steps of slicing and polishing semiconductor wafers are more difficult with silicon carbide. Similarly, its resistance to chemical attack make it difficult to etch in conventional fashion.

Nevertheless, based on a great deal of research and discovery in this particular field, including that carried out by the assignee of the present invention, a number of advances have been made in the growth of silicon carbide and its fabrication into useful devices. Accordingly, commercial devices are now available that incorporate silicon carbide for high-power radio frequency (RF) and microwave applications, for other high-power, high-voltage applications, and as a substrate for other useful semiconductor materials such as the Group III-nitrides.

Silicon carbide has particular advantages as a substrate for optoelectronic devices, and in particular light emitting diodes (LEDs). Since silicon carbide can be conductively doped, vertical devices (i.e. devices having anode and cathode contacts on opposite sides of the chip) can be formed. Vertical devices are compatible with most modern LED packaging equipment, which makes packaging the devices easier. In addition, silicon carbide has a small lattice mismatch with gallium nitride and other III-nitride materials.

In many new applications, LED chips are mounted in a flip-chip configuration with the epitaxial side down, permitting light to exit the device through the substrate. Flip-chip mounting is particularly advantageous for devices formed on silicon carbide substrates because of the higher index of refraction of silicon carbide as compared with that of the nitride regions of the devices in which the light is generated. However, silicon carbide can absorb some light passing through it before it is extracted, resulting in a reduced optical extraction efficiency.

Conventional silicon carbide (SiC)-based LEDs have a substrate thickness of approximately 200-500 µm. Since the SiC substrate is not a perfect conductor, the substrate increases the forward voltage (Vf) required to operate the device at a given current level. For example, the C450-CB230-E1000 LED, a typical SiC based device available from Cree, Inc. (Durham, N.C., USA) has a chip thickness of 250 +/+25 µm and a forward operating voltage of 3.5 V at 10 mA forward operating current. Reducing the forward voltage of the device would yield a proportionate reduction in power consumption since P=VI, i.e. the power consumed by the device is equal to the voltage across the device times the current through the device.

Moreover, in many new applications such as cellular phone backlighting, LED chips are packaged as surface mount devices to reduce the thickness of the optoelectronic component, which permits system designers to reduce the overall thickness of end products such as cellular phones. Accordingly, it is desirable to reduce the thickness of the LED chip to further reduce the thickness of an end product.

Accordingly, it is desirable to reduce the thickness of the SiC substrate in order to improve the operating characteristics of devices formed thereon. For example, the silicon carbide substrates may be thinned from their normal thickness down to thicknesses as low as about 100 microns or less.

Because the silicon carbide wafer must be thick enough to provide adequate mechanical stability during epitaxial growth steps, the wafer is ordinarily thinned after epitaxial deposition of the nitride layers and fabrication of devices. In order to thin the silicon carbide, the epiwafer (which comprises a growth substrate on which one or more epitaxial layers have been formed) is ordinarily mounted epi-side down on a carrier wafer such as a second silicon carbide wafer. The backside (i.e. the side opposite which the epitaxial layers are formed) of the mounted growth wafer is then thinned to the desired thickness.

However, problems with the carrier wafer may result in loss of yield from the substrate thinning process. Accordingly, there is a need for better methods of manufacturing carrier wafers, and better resulting carrier wafers.

SUMMARY

A process for manufacturing a carrier wafer includes sorting of standard wafer blanks into batches by thickness to ensure that all starting wafers in a batch are within a predetermined tolerance. In some embodiments, the edges of the wafer blanks are then ground to create a predetermined edge profile. In some embodiments, carrier wafers meeting the nominal tolerance are then lapped or ground to within 10 microns of the final target thickness, which in some embodiments is 400 microns. The wafers are then polished to the final desired thickness.

In some embodiments, the carrier wafers are lapped prior to being polished. In other embodiments, the carrier wafers are ground prior to being polished. In still other embodiments, the carrier wafers are both lapped and ground prior to being polished.

Embodiments of the invention provide a lapping process that employs, for example, a double side lapping machine with a plate diameter greater than 30" and a polishing template diameter greater than 9". In some embodiments the lapping machine may have cast iron or steel plates with square grids cut at 10-30 mm spacing. In some embodiments the plates have a plate flatness of less than 15 microns. In some embodiments the machine includes steel polishing templates with a thickness of 70-90% of final post lap thickness. In some embodiments, the pocket diameter of the polishing template is 0.25 mm greater than carrier wafer diameter.

A diamond particle abrasive suspended in lapping fluid is applied directly to plates during the lapping process. Alternative abrasives such as boron carbide or silicon carbide may be used. During some embodiments of the lapping process, the machine is set to apply greater than 1 psi pressure to the carrier wafers.

In some embodiments the grind process may employ a single side grind of each face of the wafer using cross-feed or in-feed grinder to a target thickness of about 10 microns thicker than a final target thickness. In some embodiments, a small batch size is used (e.g. 1-10 wafers at a time). In some embodiments, the wafer is pulled flat during the grind with porous vacuum chuck.

In some embodiments, the carrier wafers are then polished to the final target thickness, which in some embodiments is of 400 microns, using predetermined polish specifications. In other embodiments a single grinding step can produce the desired thickness, surface roughness and total thickness variation (TTV), and if so, further lapping and polishing are not required.

In some embodiments, the invention includes a carrier wafer having a nominal thickness of 400 microns and a total thickness variation (TTV) of less than one micron.

In some embodiments, the invention includes a carrier wafer having a nominal thickness of 400 microns and an average roughness (Ra) of less than 50 nm.

In some embodiments, the invention includes a carrier wafer having a nominal thickness of 400 microns, a total thickness variation (TTV) of less than one micron, and an average roughness Ra of less than 50 nm.

In some embodiments, the carrier wafer comprises quartz, borosilicate glass, sapphire, silicon, or silicon carbide.

The foregoing and other objects and advantages of the invention and the manner in which the same are accomplished will become clearer based on the followed detailed description taken in conjunction with the accompanying drawings.

DETAILED DESCRIPTION

Figure 1A:
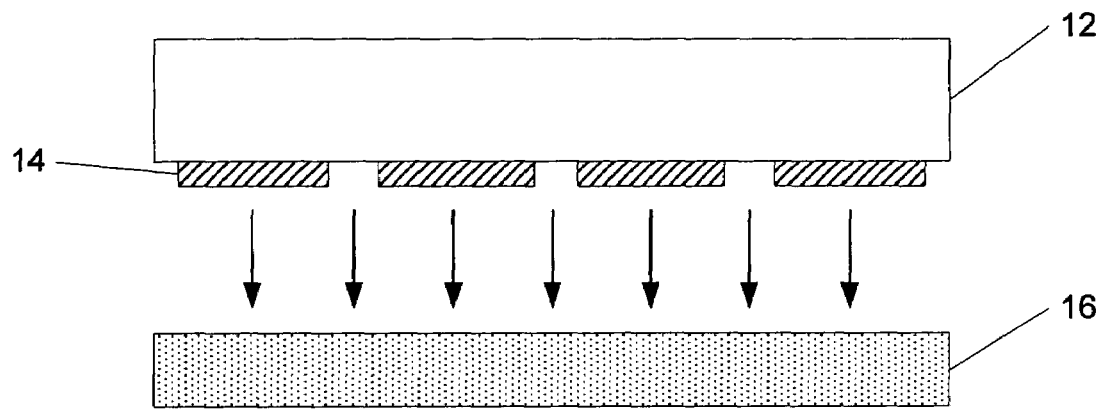
FIGS. 1A through 1C are schematic drawings showing the mounting of an epiwafer onto a carrier wafer.

The present invention now will be described more fully hereinafter with reference to the accompanying drawings, in which embodiments of the invention are shown. This invention should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, while the present invention is described with respect to semiconductor wafers and diced chips, such chips may be diced into arbitrary sizes. Accordingly, the present invention is not limited to the relative size and spacing illustrated in the accompanying figures. In addition, certain features of the drawings are illustrated in exaggerated dimensions for clarity of drawing and ease of explanation.

Embodiments of the invention now will be described generally with reference to silicon carbide-based substrates having gallium nitride-based LEDs formed thereon. However, it will be understood by those having skill in the art that many embodiments of the invention may be employed with many different combinations of substrate and epitaxial layers. For example, combinations can include aluminum gallium indium phosphide (AlGaInP) diodes on gallium phosphide (GaP) substrates; indium gallium arsenide (InGaAs) diodes on gallium arsenide (GaAs) substrates; aluminum gallium arsenide (AlGaAs) diodes on GaAs substrates; silicon carbide (SiC) diodes on SiC or sapphire (Al2O3) substrates; and/or a nitride-based diodes on gallium nitride (GaN), silicon carbide, aluminum nitride (AlN), sapphire, zinc oxide (ZnO) and other substrates or combinations of substrates.

GaN-based light emitting diodes (LEDs) typically comprise an insulating or semiconducting substrate such as SiC or sapphire on which a plurality of GaN-based epitaxial layers are deposited. The epitaxial layers comprise an active region having a p-n junction that emits light when energized.

The term "substrate" is used herein in a sense that is broad enough to include both a bulk single crystal (usually cut from a boule) as well as a device precursor structure that can include one or more epitaxial layers, but which fundamentally (although not necessarily exclusively) serves as the physical and electronic support for a device formed thereon.

The silicon carbide substrate upon which the device (or devices, or device precursors) is formed can be taken from a larger crystal (or "boule"), typically by sawing a silicon carbide substrate wafer from a silicon carbide boule. In most circumstances, the sawed substrate wafer is lapped, polished, etched (typically using a dry etch such as a reactive ion etch, or RIE), and cleaned (with an acid or solvent) prior to conducting the first isotropic etch of the method of the invention. The term "lapped" is used in its typical sense; i.e., to describe the steps of flattening the wafer surfaces using a counter-rotating lapping machine and an abrasive (e.g. diamond) slurry. Lapping helps make the wafer surfaces flat and parallel and reduces mechanical defects such as saw markings. Similarly, the polishing etching and cleaning steps are otherwise carried out conventionally prior to the steps of the present invention. Thinning of silicon carbide wafers is described in U.S. patent application Publication No. 20050151138, which is hereby incorporated entirely herein by reference.

Figure 1B:
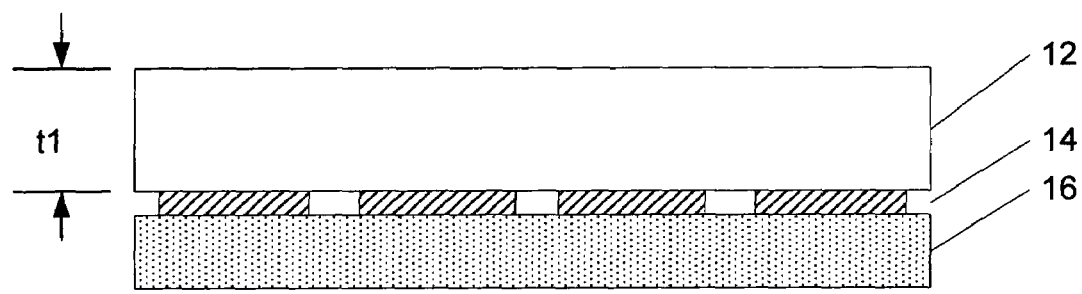
Figure 1C:
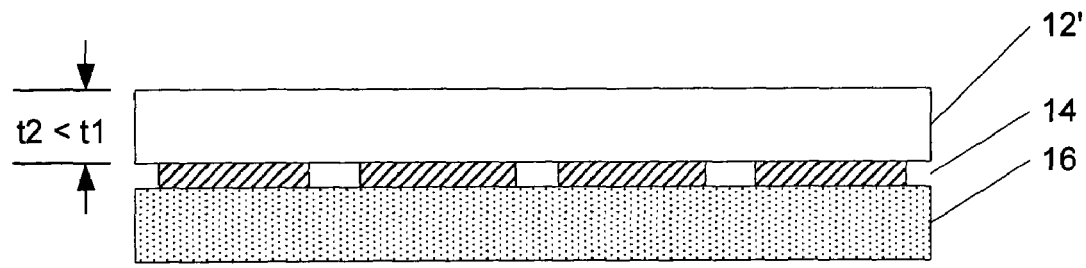

As shown in FIGS. 1A-1C, a SiC device precursor wafer 12 on which a number of gallium nitride-based LED mesas 14 have been formed is bonded using an adhesive tape or a spin-on adhesive to a wafer carrier 16. Wafer carrier 16 may comprise quartz, borosilicate glass, sapphire, silicon, silicon carbide or any other suitable material. The LED mesas are formed by depositing epitaxial semiconductor layers on the device precursor substrate wafer 12 then masking and selectively etching the epitaxial layers to form isolated mesa structures. The device precursor wafer 12 may have a thickness t1 of about 250 μm and in some cases up to 400 μm.

The wafer carrier 16 is then mounted on a grinder (not shown) and the device precursor substrate 12 is thinned to a thickness t2 of less than the starting thickness t1. For a 2 inch wafer with a 250 μm starting thickness, the precursor substrate 12 is thinned to 150 μm, and preferably to less than 100 μm. Because the starting thickness wafers is sometimes more than 250 μm, they may be thinned proportionally as needed or desired, but not necessarily to 150 μm or less. In order to measure the reduction in thickness of substrate 12, however, the thickness of the entire structure comprising wafer 12 and the wafer carrier 16 must be measured. Accordingly, variations in thickness of wafer carrier 16 may result in an incorrect thickness of the thinned wafer 12'.

The surface of the thinned device precursor wafer 12' may then be lapped if surface texturing is desired. After cleaning, a reactive ion etch process such as the process described in U.S. Pat. No. 4,946,547 (which is assigned to the assignee of the present invention and which is incorporated herein by reference) may be used to remove the damaged surface layer resulting from the thinning operation. Ohmic contacts to the substrate may then be formed as described in U.S. patent application Publication. No. 20050104072, which is incorporated entirely herein by reference. Subsequently, the device precursor substrate 12 (including the fabricated LED devices) is separated from the carrier wafer 16 by heating the adhesive a sufficient amount to cause the adhesive to dissolve. The precursor wafer 12 is then diced into individual devices, usually by sawing.

Figure 2:
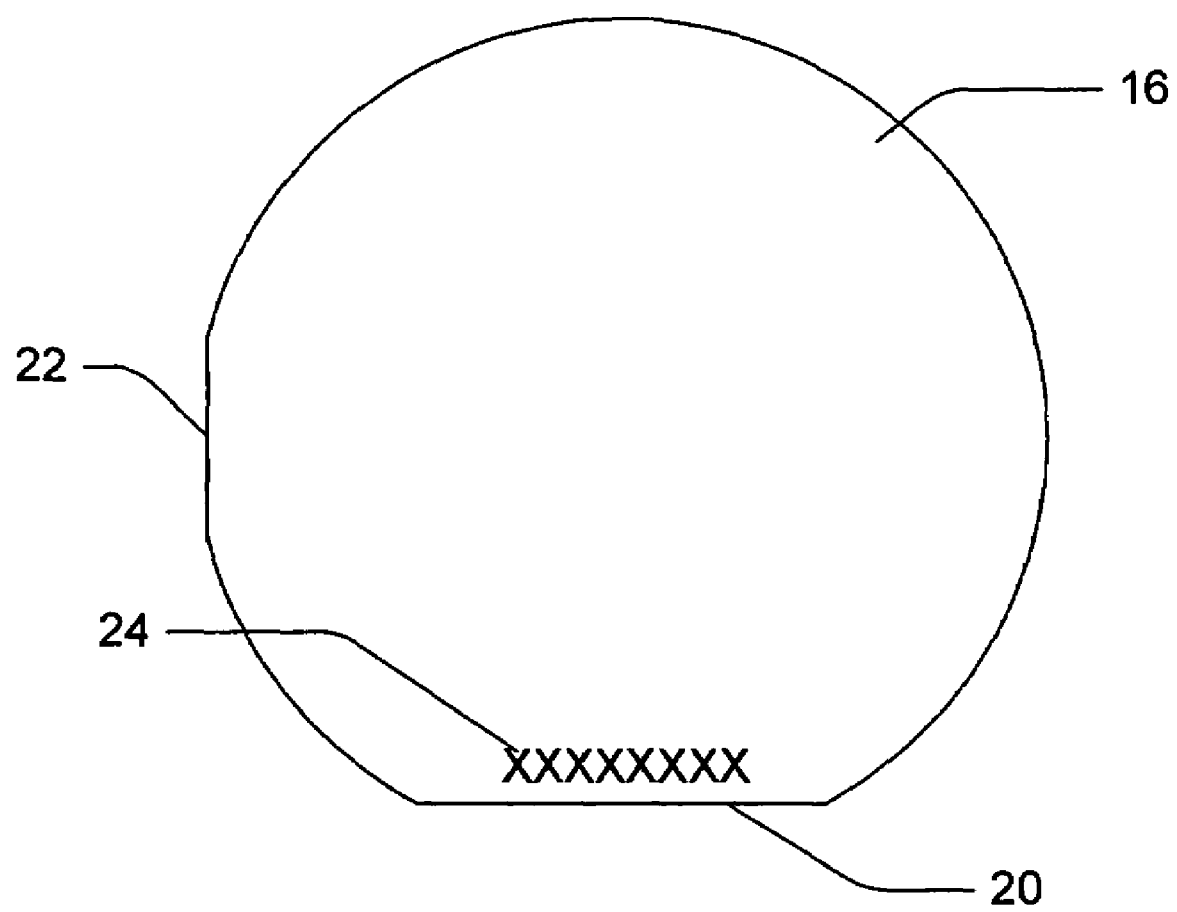
FIG. 2 illustrates a typical carrier wafer in plan view.

A representative wafer carrier 16 is illustrated in FIG. 2. Wafer carrier 16, which may comprise quartz, borosilicate glass, sapphire, silicon, silicon carbide or any other suitable material includes a primary flat 20 and a secondary flat 22 which are ground into the boule from which the wafer was cut. Primary flat 20 and secondary flat 22 serve to identify the doping and orientation of the carrier wafer 16. In addition, the carrier wafer 16 includes a laser-scribed identification mark 24. In some applications, sapphire may be a superior choice for the carrier wafer 16 as compared to SiC due to sapphire's greater durability. Although SiC is an extremely hard material, it is more brittle than sapphire. In addition, sapphire has a higher transparency than SiC, which is beneficial. In order to align metal layers that are patterned on the growth substrate 12, it is desirable to be able to see through the carrier. Thus, transparency is a differentiating factor.

As is apparent from the foregoing discussion, the thickness of the carrier wafer 16 must be carefully controlled to ensure that the growth substrate 12 is thinned by the appropriate amount. Other features of the carrier wafer, such as surface finish (i.e. average surface roughness Ra) and total thickness variation (TTV) must likewise be controlled in order to ensure proper thinning of the substrate 12.

A process for manufacturing a carrier wafer includes the creation of wafer blanks using industry standard techniques. The wafer blanks are then sorted by thickness into batches to ensure that the starting wafers are within a nominal tolerance. Wafers meeting the nominal tolerance are then lapped or ground to within 10 microns of the final target thickness, which in some embodiments is 400 microns. The lapping and grinding process requirements are discussed in more detail below.

The edge profile of the blank is then inspected, and the blank is marked with a laser. Finally, the carrier wafer is polished to the final target thickness using a fine lapping process. The carrier wafer is then cleaned and inspected for defects.

In some embodiments, a process for producing a 3-inch carrier wafer includes one or more of the following steps:

Initially, three-inch diameter blanks having a thickness of 450-1500 microns are cut from a boule of material using industry standard slicing processes which vary from material to material. Wafering of sapphire is well known in the art. Wafering of silicon carbide is typically accomplished using a diamond saw as described in Chapter 2 of C-M Zetterling, Process Technology for Silicon Carbide Devices (2002). A wafer ID is laser scribed into each blank and the wafers' edges are ground to the final spec diameter using a SEMI standard beveled edge profile. The wafer edge profile imparts a radius to the edge of the wafer. The edge profile provides a number of important advantages such as improved mechanical stability during handling. The edge profile also makes the double sided polish process more manufacturable.

The carrier wafers are then sorted into batches by thickness. In some embodiments, the wafers may be sorted into batches in which the range of thickness of all wafers is no greater than 10% of the amount of material removed during the lapping process described below (i.e. for a wafer lapped from 460 microns to 410 microns, 50 microns of material is to be removed; therefore, all wafers within a batch must be within a range of 5 microns or less.

Next, the carrier wafers are lapped or ground to within 10 microns of final target thickness (e.g. 410 microns for a 400 micron thick final carrier wafer). As noted earlier, in some cases the grinding step can produce the desired results without further lapping or polishing.

The lapping process may employ, for example, a double side lapping machine with a plate diameter greater than 30" and a polishing template diameter greater than 9". The lapping machine may have cast iron or steel plates with square grids cut at 10-30 mm spacing. The plates preferably have a plate flatness of less than 15 microns. The machine further may include steel polishing templates with a thickness of 70-90% of final post lap thickness. In some embodiments, the pocket diameter of the polishing templates is 0.25 mm greater than carrier wafer diameter.

A diamond particle abrasive suspended in lapping fluid is applied directly to plates during the lapping process. Alternative abrasives such as boron carbide or silicon carbide may be used.

During lapping, the machine is set to apply greater than 1 psi pressure to the carrier wafers. The speeds of the pin ring, upper and lower plate are set depending on machine attributes to achieve even removal of material from the bottom and top surface of the wafer.

The grind process may employ a single side grind of each face of the wafer using cross-feed or in-feed grinder to a target diameter of 410 microns. In some embodiments, a small batch size is used (e.g. 1-10 wafers at a time). The wafer is pulled flat during the grind with porous vacuum chuck.

After lapping and/or grinding, the edge profile and laser mark are inspected. If the starting thickness of the blank is too high, then the laser mark and edge profile may need to be reworked.

The carrier wafers are then polished to the final target thickness, which in some embodiments is of 400 microns. In some embodiments, the wafer polish system incorporates the following specifications:

double side polishing machine with plate diameter greater than 30";
  carrier diameter greater than 9";
  hard intermediate polish pad;
  plate flatness of less than 15 microns;
  steel carriers 300-325 microns thick with a pocket diameter 0.25 mm greater than carrier wafer diameter;
  a diamond particle abrasive suspended in polishing vehicle applied directly to the pad during process. Alternative abrasives such as boron carbide or silicon carbide may be used;
  apply greater than 1 psi pressure to the carrier wafers during polishing; and
  speeds of the pin ring, upper and lower plate are set depending on machine attributes to achieve even removal of material from the bottom and top surface of the wafer.

The wafers are then cleaned and inspected for defects.

Resulting specifications for some embodiments of the carrier wafer are as follows:

| Specification | Value |
| --- | --- |
| Material | Silicon, Silicon Carbide, Borosilicate (glass), Quartz, or Sapphire |

-continued

| Specification | Value |
| --- | --- |
| Diameter | 51.18 mm + 0.0/−0.13 mm |
| | 2.015" + 0.0/−0.005" |
| | or |
| | 76.58 mm + 0.0/− 0.13 mm |
| | 3.015" + 0.0/−0.005" |
| Edge Profile | Beveled (Semi Standard) |
| Thickness Centerpoint | 400 +/−1.5 um |
| Total Thickness Variation (TTV) | <1 microns |
| Surface Finish   Front Face | Polished or Ground (Ra < 50 nm) |
| Back Face | Polished or Ground (Ra < 50 nm) |
| | (Double Side Polished or Ground) |

As the table indicates, in some embodiments the carrier wafers are often larger in diameter than the device precursor wafers; e.g. 2.015" or 3.015" for the carrier wafers versus 2.00" or 3.00" for the device precursor wafers. The larger diameter of the carrier wafer helps protect the edges of the device precursor wafer during thinning and subsequent processing. Additionally, the carrier wafer's larger diameter prevents slight misalignments between the carrier and precursor wafers from adversely affecting or risking the precursor wafer.

Certain specifications which would ordinarily be specified for semiconductor wafers such as doping level, conductivity and orientation are not relevant for the use of the wafer as a carrier wafer for grinding as described herein.

Although the present invention has been described with respect to 2" and 3" carrier wafers, wafers of other sizes could be used and the technique is expected to be applicable to 100 millimeter wafers as well.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A method of preparing carrier wafers for semiconductor device manufacture, the method comprising:
   sorting a plurality of standard carrier wafer blanks into batches by thickness to define a batch of starting carrier wafers that are within a predetermined tolerance of one another;
   reducing the thickness of the sorted carrier wafers to within 10 microns of a final target thickness;
   polishing the sorted carrier wafers to the final target thickness;
   thereafter mounting at least one of the polished carrier wafers to a device precursor wafer having at least one semiconductor epitaxial layer on a substrate by joining one surface of the carrier wafer to the epitaxial layer on the substrate;
   thereafter reducing the thickness of the device precursor wafer by removing material from the device precursor substrate opposite the joined epitaxial layer; and
   thereafter separating the device precursor wafer from the carrier wafer.

2. A wafer preparation method according to claim 1 comprising mounting the polished carrier wafer to the device precursor substrate wafer with an adhesive selected from the group consisting of adhesive tape and spin-on adhesive.

3. A wafer preparation method according to claim 1 comprising grinding the sorted carrier wafers to reduce their thickness to within 10 microns of a final target thickness and within a final TTV of less than one micron.

4. A wafer preparation method according to claim 1 comprising lapping the sorted carrier wafers to reduce their thickness to within 10 microns of a final target thickness and within a final TTV of less than one micron.

5. A wafer preparation method according to claim 1 further comprising grinding the edges of the sorted carrier wafer blanks to create a predetermined edge profile.

6. A wafer preparation method according to claim 1 comprising sorting carrier wafer blanks selected from the group consisting of quartz, borosilicate glass, sapphire, silicon, and silicon carbide.

7. A wafer preparation method according to claim 1 comprising lapping and grinding the carrier wafers prior to the step of polishing the carrier wafers.

8. A method according to claim 1 comprising joining the carrier wafer to the device precursor wafer that is a combination of a substrate and at least one epitaxial layer selected from the group consisting of aluminum gallium indium phosphide diodes on gallium phosphide substrates; indium gallium arsenide diodes on gallium arsenide substrates;
   aluminum gallium arsenide diodes on gallium arsenide substrates; silicon carbide diodes on silicon carbide substrates; silicon carbide diodes on sapphire substrates.

9. A method according to claim 1 comprising grinding the device precursor wafer substrate to a thickness less than 150 microns.

10. A method according to claim 1 comprising mounting the polished carrier wafer to a device precursor wafer that is smaller in diameter than the polished carrier wafer.

11. A method according to claim 1 comprising marking the carrier wafer blank with a laser following the lapping and grinding steps to the final target thickness.

12. A method according to claim 1 further comprising dicing the device precursor wafer into individual devices.

13. A wafer preparation method according to claim 1 comprising polishing the sorted carrier wafer blanks to a final target thickness of 400 microns.

14. A wafer preparation method according to claim 13 comprising polishing the sorted carrier wafer blanks to a total thickness variation (TTV) of less than one micron.

15. A wafer preparation method according to claim 13 comprising polishing the sorted carrier wafer blanks to an average roughness Ra of less than 50 nm.

16. A method according to claim 1 comprising joining the carrier wafer to the device precursor wafer that is a combination of a substrate and at least one epitaxial layer selected from the group consisting of nitride based diodes on gallium nitride, nitride based diodes on silicon carbide, nitride based diodes on aluminum nitride, nitride based diodes on sapphire, and nitride based diodes on zinc oxide.

17. A method according to claim 16 comprising preparing the device precursor wafer by:
   sawing a silicon carbide substrate wafer from a silicon carbide boule;
   thereafter lapping, polishing and cleaning the substrate wafer; and
   thereafter conducting a nonselective etch on the substrate wafer;
   and thereafter adding the epitaxial layers to the substrate wafer.

18. A method according to claim 1 comprising positioning the polished carrier wafer on a grinder and grinding the device precursor wafer substrate.

19. A method according to claim 18 comprising grinding the device precursor substrate to a thickness less than 100 microns.

20. A method according to claim 1 comprising sorting the carrier wafers into batches in which the range of thickness of the carrier wafers in the batch is no greater than 10 percent of the amount of material removed during the step of reducing the thickness of the carrier wafers.

21. A method according to claim 20 comprising removing 50 microns of material on carrier wafers within the batch that are within a range of five microns or less of one another.

22. A method according to claim 20 comprising lapping the sorted carrier wafers.

23. A method according to claim 20 comprising grinding the sorted carrier wafers.

24. A method according to claim 20 comprising lapping the carrier wafers to a final target thickness of about 400 microns.

25. A wafer preparation method according to claim 1 comprising cleaning the device precursor substrate surface following the step of reducing the thickness.

26. A wafer preparation method according to claim 25 comprising etching the cleaned substrate surface.

27. A wafer preparation method according to claim 25 comprising adding an ohmic contact metal to the cleaned substrate surface of the device precursor wafer opposite the epitaxial layer.

* * * * *